(12) United States Patent
Gai et al.

(10) Patent No.: US 9,276,015 B2
(45) Date of Patent: Mar. 1, 2016

(54) TFT ARRAY SUBSTRATE WITH METAL LAYER BETWEEN SOURCE ELECTRODE AND PIXEL ELECTRODE

(71) Applicant: BOE TECHNOLOGY GROUP CO., LTD., Beijing (CN)

(72) Inventors: Cuili Gai, Beijing (CN); Zhuo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 99 days.

(21) Appl. No.: 14/126,653

(22) PCT Filed: Dec. 7, 2012

(86) PCT No.: PCT/CN2012/086216
§ 371 (c)(1),
(2) Date: Dec. 16, 2013

(87) PCT Pub. No.: WO2013/131390
PCT Pub. Date: Sep. 12, 2013

(65) Prior Publication Data
US 2014/0103348 A1    Apr. 17, 2014

(30) Foreign Application Priority Data
Mar. 6, 2012   (CN) .......................... 2012 1 0057623

(51) Int. Cl.
*H01L 27/02*   (2006.01)
*H01L 27/12*   (2006.01)
(Continued)

(52) U.S. Cl.
CPC .......... *H01L 27/124* (2013.01); *H01L 27/1259* (2013.01); *H01L 29/41733* (2013.01); *H01L 29/4908* (2013.01)

(58) Field of Classification Search
CPC ...................... H01L 29/4908; H01L 29/41733
USPC ....................................................... 257/59, 72
See application file for complete search history.

(56) References Cited

U.S. PATENT DOCUMENTS

| | | | |
|---|---|---|---|
| 8,860,028 B2 * | 10/2014 | Kwack ............................ | 257/59 |
| 2002/0050599 A1 | 5/2002 | Lee et al. | |
| 2014/0103348 A1 | 4/2014 | Gai et al. | |

FOREIGN PATENT DOCUMENTS

| | | |
|---|---|---|
| CN | 101114087 A | 1/2008 |
| CN | 101325201 A | 12/2008 |

(Continued)

OTHER PUBLICATIONS

International Preliminary Report on Patentability for International Application No. PCT/CN2012/086216 dated Sep. 9, 2014, 9pgs.
(Continued)

*Primary Examiner* — Marc Armand
*Assistant Examiner* — Tifney Skyles
(74) *Attorney, Agent, or Firm* — Ladas & Parry LLP

(57) ABSTRACT

A TFT array substrate, a manufacturing method thereof and a display apparatus. The TFT array substrate comprises: a substrate (10) having a gate electrode (12), a gate insulation layer (17), a semiconductor active layer (18), a data line, a source electrode (14)/a drain electrode (15), a pixel electrode (16) formed thereon. The data line being connected with the source electrode (14). The drain electrode (15) is connected with the pixel electrode (16), wherein a first insulation layer (19), a metal layer (20) and a second insulation layer (21) are sequentially formed between the source electrode (14)/a drain electrode (15) and the pixel electrode (16). The metal layer (20) is connected with the stable voltage signal line through a through-hole (23) of the metal layer lead, thus the influence of the coupling capacitance of the TFT array substrate to the voltage of the pixel electrode is reduced, and meanwhile, the aperture ratio of the pixel unit is increased.

19 Claims, 1 Drawing Sheet

(51) Int. Cl.
*H01L 29/49* (2006.01)
*H01L 29/417* (2006.01)

(56) References Cited

FOREIGN PATENT DOCUMENTS

CN 102654702 A 9/2012
JP 08338998 A 12/1996
KR 20110069378 A 6/2011

OTHER PUBLICATIONS

First Office Action for CN 2012-10057623.3 (in Chinese language) issued by the State Intellectual Property Office ("SIPO") Jan. 20, 2014, five (5) pages.

English translation of the First Office Action for CN 2012-10057623. 3, listed above, two (2) pages.

PCT International Search Report ("ISR") rendered Dec. 12, 2012 by the International Searching Authority ("ISA") for PCT/CN2012/086216, fourteen (14) pages.

English translation of CN101114087 (A), listed above, twenty-three (23) pages.

English translation of CN 102654702 (A), listed above, thirteen (13) pages.

English translation of CN10132501(A), listed above, twenty-four (24) pages.

English abstract of JP 8338998 (A), listed above, eight (8) pages.

English translation of KR 20110069378 (A), listed above, nine (9) pages.

\* cited by examiner

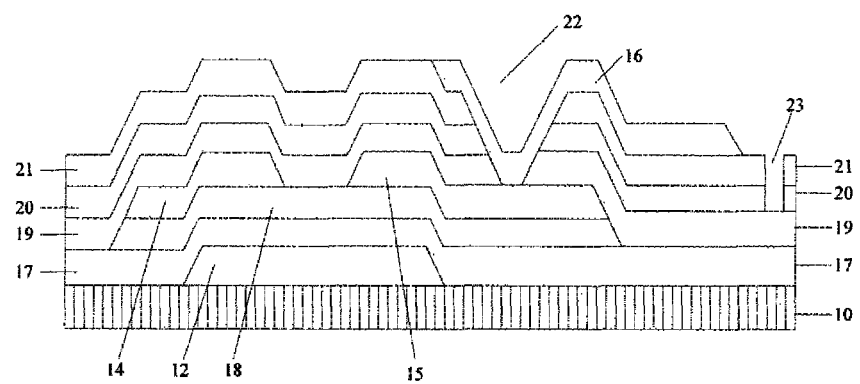

TFT ARRAY SUBSTRATE WITH METAL LAYER BETWEEN SOURCE ELECTRODE AND PIXEL ELECTRODE

CROSS REFERENCE TO RELATED APPLICATIONS

This application is based on International Application No. PCT/CN2012/086216 filed on Dec. 7, 2012, which claims priority to Chinese National Application No. 201210057623.3 filed on Mar. 6, 2012, the contents of which are incorporated herein by reference.

FIELD OF THE INVENTION

The embodiments of the present invention relate to a TFT array substrate, a manufacturing method of the TFT array substrate and a display apparatus.

BACKGROUND

With the development of technology and network, electronic display technology has been taken as a widely used technology. Currently, in addition to widely used liquid crystal display (LCD) apparatus, an electronic paper, which is a substitute for paper sheet read by people, has also been developed quickly.

Active driving modes of the LCD apparatus and the electronic paper display apparatus generally adopt an active matrix driving technology, such as a manner of driving by a thin film transistor (TFT) array substrate.

In the procedure of implementing the TFT array substrate, generally, a coupling capacitance may be generated between a pixel electrode and a source electrode. To reduce the coupling capacitance between the pixel electrode and the source electrode, an overlapping area between the pixel electrode and the source electrode is generally reduced by reducing an area of the pixel electrode; however, this also reduces an aperture ratio of the pixel unit at the same time, so that it would influence a contrast of the electronic display apparatus driven by the TFT array substrate.

SUMMARY

One embodiment of the present invention provides a TFT array substrate, which comprises: a substrate; and a gate line, a gate electrode, a gate insulation layer, a semiconductor active layer, a data line, source/drain electrodes, a pixel electrode formed on the substrate, the data line being connected with the source electrode, the drain electrode being connected with the pixel electrode. A first insulation layer, a metal layer and a second insulation layer are sequentially formed between the source/drain electrodes and the pixel electrode, and the metal layer is connected with a stable voltage signal line through a metal layer lead via hole.

Another embodiment of the present invention provides a method of manufacturing a TFT array substrate, comprising: forming a gate line, a gate electrode, a gate insulation layer, a semiconductor active layer, a data line, source/drain electrodes, a pixel electrode on a substrate. The method further comprises: sequentially forming a first insulation layer, a metal layer and a second insulation layer between the source/drain electrodes and the pixel electrode.

Another embodiment of the present invention provides a display apparatus, comprising the TFT array substrate according to any one of the embodiments of the present invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 is a sectional view along a direction parallel to a gate line of a TFT region of a TFT array substrate provided by an embodiment of the present invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the present invention provides a TFT array substrate, as shown in FIG. 1. FIG. 1 is a sectional view along a direction parallel to a gate line of a TFT region of the TFT array substrate, and a data line and the gate line are not shown in FIG. 1. The Twisted Nematic (TN) type TFT array substrate is described below in detail as an example. The array substrate includes: a substrate 10; a gate line and a gate electrode 12, formed on the substrate 10; a gate insulation layer 17, formed on the substrate formed with the gate line and the gate electrode 12; a semiconductor active layer 18, formed the gate insulation layer 17 corresponding to the TFT region; a data line, a source electrode 14, a drain electrode 15, and a pixel electrode 16, formed on the substrate formed with the gate line, the gate electrode 12, the gate insulation layer 17 and the semiconductor active layer 18. A metal layer 20 is formed between the source electrode 14, the drain electrode 15 and the pixel electrode 16. To assure insulation between the source/drain electrodes 14 and 15 and the metal layer 20, a first insulation layer 19 is formed between the source/drain electrodes 14 and 15 and the metal layer 20. To assure insulation between the metal layer 20 and the pixel electrode 16, a second insulation layer 21 is formed between the metal layer 20 and the pixel electrode 16. The data line is connected with the source electrode 14, and the pixel electrode 16 is connected with the drain 15 through a via hole 22.

In FIG. 1, the above via hole 22 penetrates through the first insulation layer 19, the metal layer 20 and the second insulation layer 21, and is located over the drain electrode 15, and thus it may connect the pixel electrode 16 with the drain electrode 15. In addition, although not shown, an insulation layer which makes the pixel electrode 16 and the metal layer 20 to be insulated from each other may be further formed on a sidewall of the via hole 22.

For example, the gate line and the gate electrode are formed by patterning a gate metal layer, and the source/drain electrodes and the data line are formed by patterning a source/drain metal layer, and thus the gate line and the gate electrode are located at the same layer, and the source/drain electrodes and the data line are located at the same layer.

In order to reduce the influence of the coupling capacitance on a voltage of the pixel electrode 16 while increasing the aperture ratio, the metal layer 20 may be connected with a stable voltage signal source by a metal layer lead via hole 23.

In this way, since the voltage of the pixel electrode 16 remains constant, it ensures that the coupling capacitance between the pixel electrode 16 and the metal layer 20 cannot generate a process of charging and discharging, so that the coupling capacitance between the pixel electrode 16 and the metal layer 20 cannot exert influence on the voltage of the pixel electrode 16.

In one embodiment, the metal layer 20 may be connected to a ground line by the metal layer lead via hole 23. It is shown in FIG. 1 that the metal layer lead via hole 23 penetrates through the second insulation layer 21 and the metal layer 20, however, the via hole 23 may also only penetrate through the second insulation layer 21, and it may adopt any suitable form as long as it can expose the metal layer 20 and enable the metal layer 20 to be connected with the stable voltage signal line.

The metal layer 20 may be a transparent metal layer, such as indium tin oxide or indium zinc oxide. The TFT array substrate using the transparent metal layer may be applied to a transmissive type electronic display apparatus, such as a TFT LCD display.

The metal layer 20 may also be a non-transparent metal layer, and for example, the metal layer 20 may be any one of non-transparent metals such as molybdenum, aluminum, aluminum-nickel alloy, molybdenum-tungsten alloy, chromium, copper and so on. The TFT array substrate using the non-transparent metal layer may be applied to a reflective type electronic display apparatus, such as a display apparatus of an active electronic paper. Further, since the non-transparent metal layer is formed on the source electrode 14 and the drain electrode 15 of the TFT array substrate, a TFT channel region between the source electrode 14 and the drain electrode 15 is also covered, and the TFT channel will not influence the image displaying of the active electronic paper due to a leakage current generated by the external light, so that the light reflectance of the active electronic paper is enhanced and the displaying effect is improved.

In addition, the above embodiments gives the description only by taking a bottom-gate structure as an example, however, the array substrates according to the present invention are not limited thereto. For example, the thin film transistor (constituted by a gate electrode, a semiconductor active layer, and a source/drain electrodes) on the array substrate may also be a top-gate structure. No matter the bottom-gate structure or the top-gate structure, the gate insulation layer may be interposed between the gate electrode and the semiconductor active layer, and the semiconductor active layer is interposed between the source/drain electrodes and the gate insulation layer.

The TN type TFT array substrate is taken as an example in the above embodiments. Of course, the present invention is also suitable to other type array substrates, such as FFS type and IPS type TFT array substrates.

The first insulation layer, the metal layer and the second insulation layer is formed between the pixel electrode and the source/drain electrodes formed on the substrate, and the metal layer is connected with the stable voltage signal line. Since the voltage between the pixel electrode and the metal layer is stable, there is no charging and discharging in the coupling capacitance between the pixel electrode and the metal layer, so the coupling capacitance of the pixel electrode and the metal layer will not exert any influence on the voltage of the pixel electrode. Thus, a problem in the prior art that it needs to reduce the area of the pixel electrode due to the requirement of reducing the coupling capacitance between the source electrode and the pixel electrode, is avoided. The TFT array substrate provided by the embodiments of the present invention may reduce the influence of the coupling capacitance on the TFT array substrate on the voltage of the pixel electrode, and may also increase the aperture ration of the pixel unit.

An embodiment of the present invention provides a method of manufacturing a TFT array substrate. The following will give a detailed description by taking the four times masking process of the TN type TFT array substrate as an example, which includes:

S201: sequentially forming a gate metal layer thin film on the substrate, and forming a gate line and a gate electrode by a patterning process.

For example, a gate metal layer thin film of 1000 Å to 7000 Å is deposited on the substrate by using a magnetron sputtering process, and the metal materials may generally adopt metals such as molybdenum, aluminum, aluminum-nickel alloy, molybdenum-tungsten alloy, chromium, copper and so on, and may also use the combination structure of several above material films. Subsequently, a plurality of gate lines parallel with each other and gate electrodes connected with the gate lines are formed on the substrate through the patterning process treatment including exposure, developing, etching and removing photoresist by using a mask. The above procedure of forming the gate lines and the gate electrodes is a first masking process.

S202: subsequently, forming a gate insulation layer thin film, a semiconductor active layer thin film, a data metal layer thin film on the substrate formed with the gate lines and the gate electrodes, and forming a gate insulation layer, a semiconductor active layer and source/drain electrodes by a patterning process.

For example, the gate insulation thin film is deposited on the gate line 11 and the gate electrode 12 to a thickness of 1000 Å to 6000 Å by using a chemical vapor deposition (CVD) method, and the material of the gate insulation thin film is generally silicon nitride, and may also be silicon oxide and silicon oxynitride. Subsequently, a metal oxide thin film of 50~1000 Å may be continually deposited by using a sputtering method as the semiconductor active layer thin film. Finally, a layer of data metal layer thin film of 1000 Å to 7000 Å is deposited by using a magnetron sputtering method.

Photoresist is formed on the substrate formed with the gate insulation layer thin film, the semiconductor active layer thin film, and the data metal layer thin film, and exposure is performed to the photoresist by using a gray tone mask or half-transmissive mask, to form a photoresist completely remaining region, a photoresist partially remaining region and a photoresist completely removed region. In one pixel unit surrounded by the gate line and the data line, the photoresist completely remaining region corresponds to the data line and the source/drain electrodes, the photoresist partially remaining region corresponds to the channel region between the source electrode and the drain electrode, and the photoresist completely removed region corresponds to a region in the pixel unit other than the photoresist completely remaining region and the photoresist partially remaining region. The data metal layer thin film and the semiconductor active layer thin film in the photoresist completely removed region is etched by using an etching process; the photoresist at the photoresist partially remaining region is removed by using a plasma ashing process, to expose the data metal layer thin film at the photoresist partially remaining region; the data metal layer thin film and a part of the semiconductor active layer thin film at the photoresist partially remaining region are etched by using an etching process, to form a TFT channel; subsequently, the photoresist in the photoresist completely remaining region is removed, to form the data line and the source/drain electrodes. The above procedure of forming the gate insulation layer, the semiconductor active layer and the source/drain electrodes is a second masking process.

S203: sequentially forming a first insulation layer thin film, a metal layer thin film, a second insulation layer thin film on the substrate formed with the above source/drain electrodes, and forming a first insulation layer, a metal layer, a second insulation layer and a metal layer lead via hole by a patterning process.

For example, photoresist is formed on the substrate formed with the first insulation layer thin film, the metal layer thin film, and the second insulation layer thin film, and a photoresist completely remaining region and a photoresist completely removed region are formed by a exposure and development process on the photoresist. The photoresist completely removed region includes: a via hole connecting the drain electrode with the pixel electrode, and the metal layer lead via hole connecting the metal layer to the external stable signal source; the photoresist completely remaining region includes: the region in the pixel unit defined by the gate line and the data line other than the photoresist completely removed region. Subsequently, the photoresist completely removed region is etched, and the photoresist of the photoresist completely remaining region is removed after etching, so that the via hole connecting the drain electrode and the pixel electrode (penetrating through the first insulation layer, the metal layer and the second insulation layer), the metal layer lead via hole, the first insulation layer, the metal layer, and the second insulation layer. The above procedure of forming the via hole connecting the drain electrode and the pixel electrode, the metal layer lead via hole, the first insulation layer, the metal layer, and the second insulation layer is a third masking process.

The above metal layer may be a transparent metal layer, such as indium tin oxide or indium zinc oxide. The TFT array substrate using the transparent metal layer may be applied to a transmissive type electronic display apparatus, such as a TFT LCD display.

The metal layer may also be a non-transparent metal layer, and for example, the metal layer may be any one of non-transparent metals such as molybdenum, aluminum, aluminum-nickel alloy, molybdenum-tungsten alloy, chromium, copper and so on. The TFT array substrate using the non-transparent metal layer may be applied to a reflective type electronic display apparatus, such as a display apparatus of an active electronic paper. Further, since the non-transparent metal layer is formed on the source/drain electrodes of the TFT array substrate, a TFT channel region between the source electrode and the drain electrode is also covered, and the TFT channel will not influence the image displaying of the active electronic paper due to the leakage current generated by the external light, so that the light reflectance of the active electronic paper is enhanced and the displaying effect is improved.

The metal layer may be connected with a certain stable voltage signal (such as, a voltage of +5V) through the metal layer lead via hole. In one example, the metal layer may be directly connected with a ground line through the metal layer lead via hole.

S204: forming a pixel electrode layer thin film on the second insulation layer, and forming the pixel electrode by a patterning process.

The step S204 includes: forming a pixel electrode layer film on the second insulation layer, and the specific material of the pixel electrode may be indium tin oxide or indium zinc oxide. Subsequently, the pixel electrode is formed by processes of exposure, developing, etching and removing the photoresist using a pixel electrode mask.

The above patterning process includes: processes of applying photoresist, exposure, developing, etching, and removing the photoresist and so on.

For example, the pixel electrode is connected with the drain electrode through the via hole over the drain electrode, and the metal layer lead via hole may be formed at a position not covered by the pixel electrode.

The embodiment of the method of manufacturing the present TFT array substrate is described in detail by taking the four-times masking process as an example. Of course, five-times masking process may also be achieved, and it also needs to form a first insulation layer, a metal layer, a second metal layer, and a metal layer lead via hole during the process of forming the via hole connecting the drain electrode and the pixel electrode. With regard to other mask processes, they also need to form a first insulation layer, a metal layer, a second metal layer, and a metal layer lead via hole during the process of forming the via hole connecting the drain electrode and the pixel electrode. Alternatively, the first insulation layer, the metal layer, the second insulation layer and the metal layer lead via hole may be separately formed between the source/drain electrodes and the pixel electrode by using one mask process. Here, the present invention does not give particular definition to it.

The TN type TFT array substrate is taken as an example in the above embodiments. Of course, the present invention is also suitable to other type array substrates, such as FFS type and IPS type TFT array substrates. In addition to being applied to a liquid crystal display and an electronic paper device, the above TFT array substrate may be also applied to displays which need active driving such as an organic light emitting display (OLED).

In the manufacturing method of the TFT array substrate provided by the embodiments of the present invention, the first insulation layer, the metal layer and the second insulation layer are formed between the pixel electrode and the source/drain electrode, and the metal layer may be connected with the stable voltage signal line through the metal layer lead via hole. Since in the TFT array substrate formed by the above method of manufacturing TFT array substrate, the metal layer connected to the stable voltage source is disposed between the source electrode and the pixel electrode, thus a process of charging and discharging will not be caused by the coupling capacitance between the pixel electrode and the metal layer, so that the coupling capacitance between the pixel electrode and the metal layer will not exert influence on the voltage of the pixel electrode. Thus, the problem in the prior art that it needs to reduce the area of the pixel electrode due to the requirement of reducing the coupling capacitance between the source electrode and the pixel electrode, is avoided. The TFT array substrate provided by the embodiments of the present invention may reduce the influence of the coupling capacitance on the TFT array substrate on the voltage of the pixel electrode, and may also increase the aperture ration of the pixel unit.

The embodiments of the present invention further provide a display apparatus comprising the above TFT array substrate, and the display apparatus may be a TFT liquid crystal display apparatus, and may also be a reflective active electronic paper display apparatus, OLED and so on. Its detailed structure is not repeated here.

The foregoing is the exemplary embodiments of the present invention, and is not intended to define the protection scope of the present invention, the scope of which is determined by the appended claims.

What is claimed is:

1. A TFT array substrate, comprising:
a substrate; and
a gate line, a gate electrode, a gate insulation layer, a semiconductor active layer, a data line, source/drain electrodes, a pixel electrode formed on the substrate, the data line being connected with the source electrode, the drain electrode being connected with the pixel electrode,
wherein a first insulation layer, a metal layer and a second insulation layer are sequentially formed between the source/drain electrodes and the pixel electrode, and the metal layer is connected with a stable voltage signal line through a metal layer lead via hole,
wherein all portions of the pixel electrode above the metal layer are shielded from the source/drain electrodes by the metal layer.

2. The substrate according to claim 1, wherein the metal layer is a transparent metal layer or a non-transparent metal layer.

3. The substrate according to claim 1, wherein the stable voltage signal line is a ground line.

4. The substrate according to claim 1, wherein the gate line and the gate electrode are located at the same layer, and the source/drain electrodes and the data line are located at the same layer.

5. The substrate according to claim 1, wherein the gate insulation layer is interposed between the gate electrode and the semiconductor active layer, and the semiconductor active layer is interposed between the source/drain electrodes and the gate insulation layer.

6. The substrate according to claim 1, wherein the pixel electrode is connected with the drain electrode through a via hole which is located over the drain electrode and penetrates through the first insulation layer, the metal layer and the second insulation layer.

7. The substrate according to claim 6, wherein the pixel electrode and the metal layer are insulated from each other by a insulation layer at a sidewall of the via hole which is over the drain electrode.

8. A method of manufacturing a TFT array substrate, comprising: forming a gate line, a gate electrode, a gate insulation layer, a semiconductor active layer, a data line, source/drain electrodes, a pixel electrode on a substrate,
wherein the method further comprises: sequentially forming a first insulation layer, a metal layer and a second insulation layer between the source/drain electrodes and the pixel electrode,
wherein all portions of the pixel electrode above the metal layer are shielded from the source/drain electrodes by the metal layer.

9. The method according to claim 8, wherein, forming the first insulation layer, the metal layer and the second insulation layer between the source/drain electrodes and the pixel electrode comprises: by a patterning process, forming the first insulation layer, the metal layer and the second insulation layer on the substrate formed with the gate line, the gate electrode, the gate insulation layer, the semiconductor active layer, the data line, the source/drain electrodes, and forming a via hole which is located over the drain and penetrates through the first insulation layer, the metal layer and the second insulation layer, and forming a metal layer lead via hole which exposes the metal layer.

10. The method according to claim 9, comprising: forming a gate insulation layer thin film on the substrate, and forming the gate line and the gate electrode by a patterning process; forming a gate insulation layer thin film, a semiconductor active layer thin film, a data metal layer thin film on the substrate formed with the gate line and the gate electrode, and forming the gate insulation layer, the semiconductor active layer and the source/drain electrodes by a patterning process; sequentially forming a first insulation layer thin film, a metal layer thin film, a second insulation layer thin film on the substrate formed with the above source/drain electrodes, and forming the first insulation layer, the metal layer, the second insulation layer, and the via hole over the drain electrode and the metal layer lead via hole by the patterning process; and forming a pixel electrode layer thin film on the second insulation layer, and forming the pixel electrode by a patterning process, wherein the pixel electrode is connected with the drain electrode through the via hole over the drain electrode.

11. The method according to claim 10, wherein the metal layer lead via hole is formed at a position not covered by the pixel electrode.

12. A display apparatus, comprising the TFT array substrate according to claim 1.

13. The display apparatus according to claim 12, wherein the display apparatus is a liquid crystal display apparatus, a reflective electronic paper display apparatus or an organic light emitting display apparatus.

14. The display apparatus according to claim 12, wherein the metal layer is a transparent metal layer or a non-transparent metal layer.

15. The display apparatus according to claim 12, wherein the stable voltage signal line is a ground line.

16. The display apparatus according to claim 12, wherein the gate line and the gate electrode are located at the same layer, and the source/drain electrodes and the data line are located at the same layer.

17. The display apparatus according to claim 12, wherein the gate insulation layer is interposed between the gate electrode and the semiconductor active layer, and the semiconductor active layer is interposed between the source/drain electrodes and the gate insulation layer.

18. The display apparatus according to claim 12, wherein the pixel electrode is connected with the drain electrode through a via hole which is located over the drain electrode and penetrates through the first insulation layer, the metal layer and the second insulation layer.

19. The display apparatus according to claim 18, wherein the pixel electrode and the metal layer are insulated from each other by a insulation layer at a sidewall of the via hole which is over the drain electrode.

* * * * *